United States Patent
Mar et al.

(10) Patent No.: US 7,185,269 B2
(45) Date of Patent: Feb. 27, 2007

(54) VITERBI DECODING DEVICE AND METHOD FOR PROCESSING MULTI-DATA INPUT INTO MULTI-DATA OUTPUT

(75) Inventors: William Mar, Taipei (TW); Kelven Cheng, Taipei (TW)

(73) Assignee: VIA Optical Solution, Inc., Taipei (TW)

(*) Notice: Subject to any disclaimer, the term of this patent is extended or adjusted under 35 U.S.C. 154(b) by 322 days.

(21) Appl. No.: 10/612,678

(22) Filed: Jul. 2, 2003

(65) Prior Publication Data
US 2004/0006735 A1  Jan. 8, 2004

(30) Foreign Application Priority Data
Jul. 3, 2002  (TW) ................ 91114690 A (51) Int. Cl.
*H03M 13/03*  (2006.01)
(52) U.S. Cl. .................... 714/795; 714/796
(58) Field of Classification Search ........... 714/796, 714/795
See application file for complete search history.

(56) References Cited

U.S. PATENT DOCUMENTS

| | | | | |
|---|---|---|---|---|
| 4,788,694 A | * | 11/1988 | Calderbank | ............. 375/295 |
| 5,418,795 A | * | 5/1995 | Itakura et al. | ............. 714/746 |
| 5,586,128 A | * | 12/1996 | Chen | ............. 714/792 |
| 5,878,092 A | * | 3/1999 | Choi | ............. 375/341 |
| 5,907,586 A | * | 5/1999 | Katsuragawa et al. | ...... 375/341 |
| 6,282,251 B1 | * | 8/2001 | Worstell | ............. 375/341 |
| 6,411,224 B1 | * | 6/2002 | Wilson et al. | ............. 341/59 |
| 6,438,180 B1 | * | 8/2002 | Kavcic et al. | ............. 375/341 |
| 6,889,154 B2 | * | 5/2005 | Ashley et al. | ............. 702/107 |

* cited by examiner

*Primary Examiner*—Albert Decady
*Assistant Examiner*—Mujtaba K. Chaudry
(74) *Attorney, Agent, or Firm*—Kirton & McConkie; Evan R. Witt (57) ABSTRACT

In a Viterbi decoder, a branch metric calculating operation of a series of received input data is performed according to different sets of target levels to realize a plurality of branch metric values, wherein said target level sets are not identical. Accumulative operations of the branch metric values are performed, respectively, and the plurality of accumulated values are compared in groups. A plurality of control signals and a plurality of least accumulated values are outputted according comparing results of the accumulated values. The least accumulated values are received and stored, and then fed back for next accumulation operations. A plurality of possible output-data state transition tracks are recoded in response to the control signals. The output data are determined according to the least accumulated values and output-data state transition tracks.

8 Claims, 8 Drawing Sheets

| x(k-2) | x(k-3) | x(k) | x(k-1) | y(k) | y(k-1) |
|---|---|---|---|---|---|
| 0(-0.5) | 0(-0.5) | 0(-0.5) | 0(-0.5) | -2 | -1.5 |
| 0(-0.5) | 1(0.5) | 0(-0.5) | 0(-0.5) | -1 | 0 |
| 1(0.5) | 1(0.5) | 0(-0.5) | 0(-0.5) | 0 | 1 |
| 1(0.5) | 1(0.5) | 0(-0.5) | 1(0.5) | 1 | 1.5 |
| 0(-0.5) | 0(-0.5) | 1(0.5) | 0(-0.5) | -1 | -1.5 |
| 0(-0.5) | 0(-0.5) | 1(0.5) | 1(0.5) | 0 | -1 |
| 1(0.5) | 0(-0.5) | 1(0.5) | 1(0.5) | 1 | 0 |
| 1(0.5) | 1(0.5) | 1(0.5) | 1(0.5) | 2 | 1.5 |

VITERBI DECODING DEVICE AND METHOD FOR PROCESSING MULTI-DATA INPUT INTO MULTI-DATA OUTPUT

FIELD OF THE INVENTION

The present invention relates to a Viterbi decoding device, and more particularly to a Viterbi decoding device with multi-data input and multi-data output. The present invention also relates to a Viterbi decoding method for processing multi-data input into multi-data output.

BACKGROUND OF THE INVENTION

Figure 1:
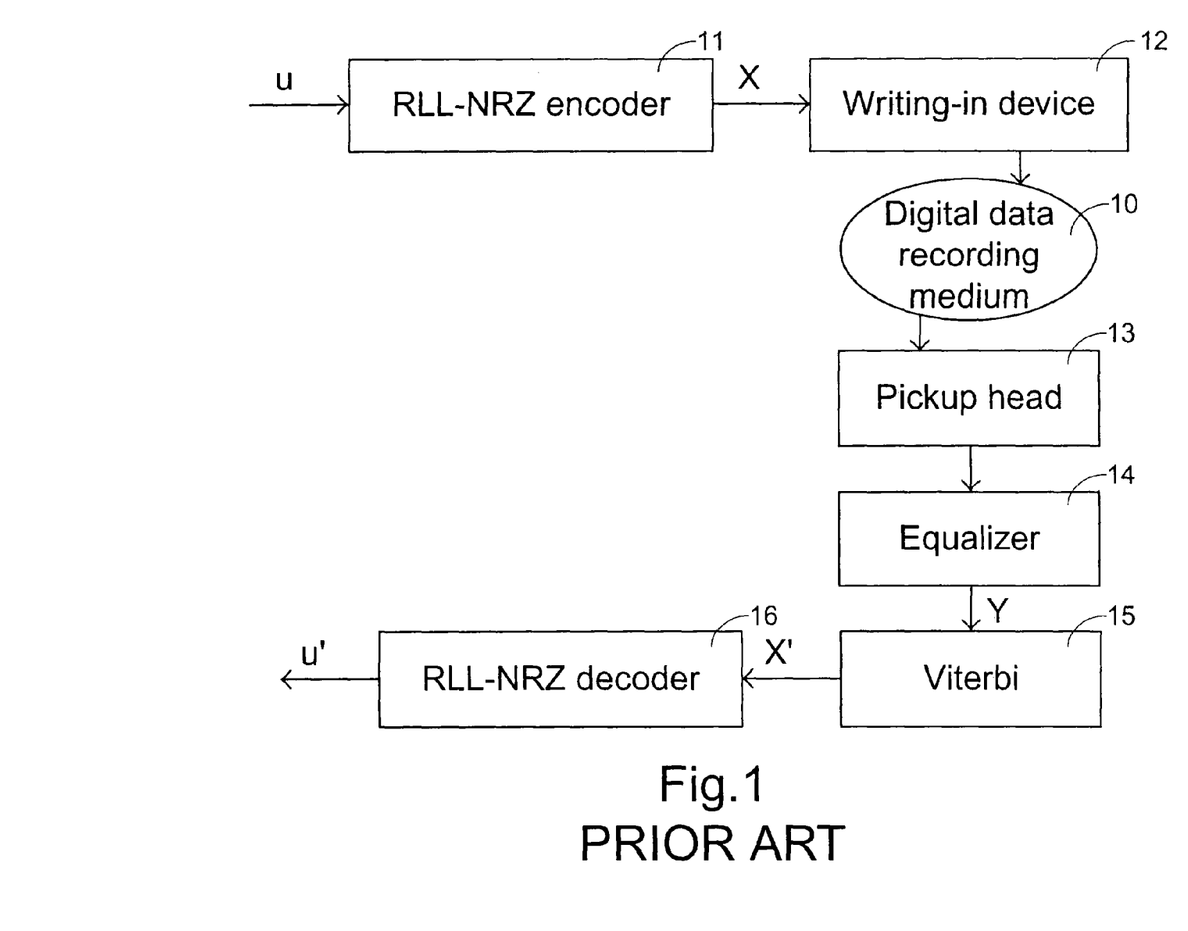
FIG. 1 is a functional block diagram schematically showing a typical digital data writing-in and reading-out system.

Please refer to FIG. 1, which is a functional block diagram schematically showing a typical digital data writing-in and reading-out system. As shown, the reference label "u" indicates a digital data sequence. A written-in signal X suitable to be recorded by a digital data recording medium is generated after the digital data sequence u is encoded by a run-length limited and non-return to zero encoder (hereinafter, RLL-NRZ encoder) 11. The written-in signal X is then written into the digital data recording medium 10 by a writing-in device 12. Afterwards, the signal stored in the digital data recording medium 10 can be read out via a pickup head 13, which is further transmitted via a channel and adjusted by an equalizer 14 into a signal Y. The signal Y is then decoded by a Viterbi decoder 15 to be transformed into a read-out signal X' having the same format as the written-in signal X. Then, a recovered digital data sequence u' is obtained by decoding the read-out signal X' with a run-length limited and non-return to zero decoder (hereinafter, RLL-NRZ decoder) 16.

The above digital data writing-in and reading-out system is generally used in a disk drive system or an optical disk drive system. Giving an optical disk drive system as an example, the equalizer 14, Viterbi decoder 15 and RLL-NRZ decoder 16 can be arranged in a control chip of the optical disk drive.

Figure 2:
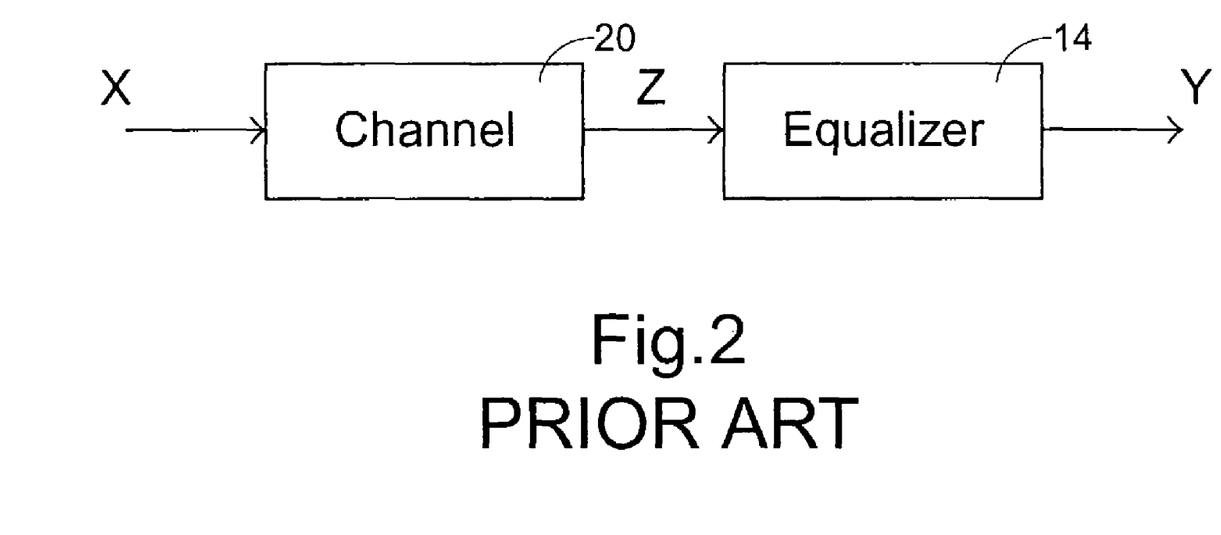
FIG. 2 is a schematic diagram showing the transformation of the written-in signal X into the signal Y via a partial response channel.

Further referring to FIG. 2, the transformation of the written-in signal X into the signal Y is illustrated. The written-in signal X, for example, consists of levels +0.5 and −0.5. Before the written-in signal X is transformed into the signal Y by the equalizer 14, it is processed into a signal Z first via a channel 20. The channel 20 substantially involves all factors that the written-in signal X encounters after it is read out from the digital data recording medium 10 and before it enters the equalizer 14. The transfer function of the channel 20 is defined as "$Z(D)/X(D)=1+a1*D+a2*D^2+a3*D^3+a4+\ldots$". On the other hand, the channel 20 and the equalizer 14 can be combined as a partial response (PR) channel with an input signal X and an output signal Y. Accordingly, the transfer function can be adjusted into "$Y(D)/X(D)=PR(1,1)=1+D$", "$Y(D)/X(D)=PR(1,2,1)=1+2*D+D^2$" or "$Y(D)/X(D)=PR(1,1,1,1)=1+D+D^2+D^3$". Table 1 lists the relationship between the transfer functions and their corresponding target levels, i.e. the ideal levels of the signal Y.

TABLE 1

| Transfer function Y(D)/X(D) | Target levels |
| --- | --- |
| PR(1,1) = 1 + D | −1, 0, 1 |
| PR(1,2,1) = 1 + 2*D + D^2 | −2, −1, 1, 2 |

TABLE 1-continued

| Transfer function Y(D)/X(D) | Target levels |
| --- | --- |
| PR(1,1,1,1) = 1 + D + D^2 + D^3 | −2, −1, 0, 1, 2 |

Figure 3:
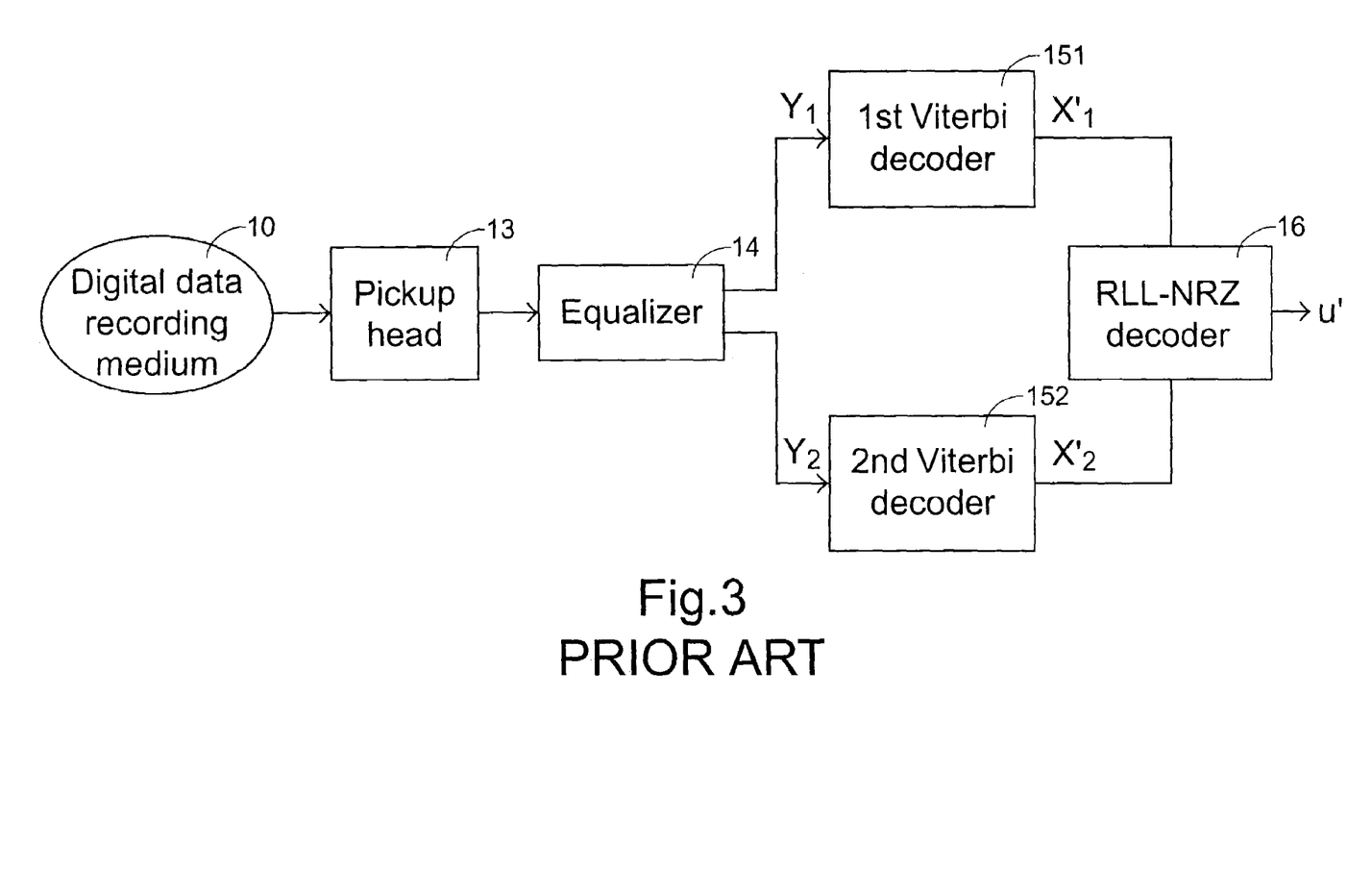
FIG. 3 is a functional block diagram schematically showing a digital data reading-out system comprising two Viterbi encoders according to prior art.

As is understood by those skilled in the art, the Viterbi decoder 15, which transforms the signal Y into the read-out signal X' having the same format as the written-in data X according to a Viterbi algorithm, involves the storage and operation of a large quantity of data. For enhancing the data-processing rate of the digital data writing-in and reading-out system, two Viterbi decoders are provided, as shown in FIG. 3. A first Viterbi decoder 151 and a second Viterbi decoder 152 are used to process the odd signal Y1 and even signal Y2 of the data sequence into two read-out signals X1' and X2', respectively. Since a Viterbi decoder has complicated circuitry, two Viterbi decoders will occupy large area of the control chip and increase cost.

SUMMARY OF THE INVENTION

Therefore, an object of the present invention is to provide a single Viterbi decoding device and method capable of processing multi-data input into multi-data output so as to save the chip space and simplify the system circuitry without adversely affecting the data-processing efficiency.

A first aspect of the present invention relates to a Viterbi decoding device with multi-data input and multi-data output. The device comprises a branch metric calculating circuit performing branch metric calculating operations of a plurality of consecutive input data according to a plurality of target level sets to obtain a plurality of branch metric values, respectively; an adder-comparator-selector unit coupled to the branch metric calculating circuit, performing accumulative additional operations of the branch metric values to obtain a plurality of accumulated values, respectively, comparing the plurality of accumulated values in groups, and outputting a plurality of control signals and a plurality of least accumulated values according to the comparing results; a metric register unit coupled to the adder-comparator-selector unit, receiving and storing the plurality of least accumulated values, then feeding back the plurality of least accumulated values to the adder-comparator-selector unit to perform next accumulative addition operations; a survivor memory unit coupled to the adder-comparator-selector unit, recording a plurality of output-data state transition tracks in response to the plurality of control signals; and a decision unit coupled to the metric register unit and the survivor memory unit, determining a plurality of consecutive output data according to the plurality of output-data state transition tracks and the plurality of least accumulated values.

Preferably, the Viterbi decoding device further comprises a normalizing circuit coupled to the adder-comparator-selector unit and the metric register unit, performing a normalized shift when the least accumulated values exceed the threshold value.

The adder-comparator-selector unit preferably comprises a plurality of accumulators coupled to the branch metric calculating circuit, performing accumulating operations of the plurality of branch metric values for the plurality of output-data state transition tracks, respectively; a plurality of comparators coupled to the plurality of accumulators, comparing the plurality of accumulated values so as to output the plurality of control signals, respectively; and a plurality of selectors coupled to the plurality of accumulators, the plurality of comparators and the metric register unit, outputting the plurality of least accumulated values that stored in the metric register unit in response to the plurality of control signals, respectively.

The metric register unit preferably comprises a plurality of registers.

The survivor memory unit preferably comprises a plurality of memories coupled in series.

According to a second aspect of the present invention, a Viterbi decoding device with a dual-data input and a dual-data output comprises a branch metric calculating circuit performing branch metric calculating operations of two consecutive input data according to two target level sets, respectively, to obtain a plurality of branch metric values; an adder-comparator-selector unit coupled to the branch metric calculating circuit, performing accumulative additional operations of the branch metric values to obtain four groups of accumulated values, respectively, comparing the accumulated values in groups, and outputting two control signals and four least accumulated values according to the comparing results; a metric register unit coupled to the adder-comparator-selector unit, receiving and storing the four least accumulated values, and transmitting the four least accumulated values back to the adder-comparator-selector unit to perform next accumulative addition operations; a survivor memory unit coupled to the adder-comparator-selector unit, recording a plurality of output-data state transition tracks in response to the two control signals; and a decision unit coupled to the metric register unit and the survivor memory unit, and determining the combinations of the two probable output-data state transition tracks as the consecutive output data according to the four least accumulated values.

Preferably, the adder-comparator-selector unit comprises a plurality of accumulators, two comparators, and two selectors. The metric register unit includes four registers. The survivor memory unit comprises a plurality of memories coupled in series.

Preferably, a plurality of output-data state transition tracks are determined according to a 3T run-length limited algorithm.

Preferably, the two target level sets are obtained via a partial response channel PR(1,1,1,1). For example, the two target level sets are (−2,−1,0,1,2) and (−1.5,−1,0,1,1.5), respectively.

A third aspect of the present invention relates to a Viterbi decoding method for processing a multi-data input into a multi-data output. The method comprises providing a plurality of target level sets; performing branch metric calculating operations of a plurality of consecutive input data according to the plurality of target level sets to obtain a plurality of branch metric values, respectively; performing accumulative additional operations of the branch metric values to obtain a plurality of accumulated values, respectively; comparing the plurality of accumulated values in groups, and outputting a plurality of control signals and a plurality of least accumulated values according to the comparing results; storing the plurality of least accumulated values, and feeding back the plurality of least accumulated values to the adder-comparator-selector unit to perform next accumulative additional operations; recording a plurality of output-data state transition tracks in response to the control signals, and determining the combinations of a plurality of probable output-data state transition tracks as the consecutive output data according to the least accumulated values.

Preferably, the consecutive input data and the consecutive output data are two-bit input and two-bit output, and eight output-data state transition tracks are recorded.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will be described more specifically with reference to the following embodiments. It is noted that the following descriptions of preferred embodiments of this invention are presented herein for purpose of illustration and description only; it is not intended to be exhaustive or to be limited to the precise form disclosed.

Figure 4:
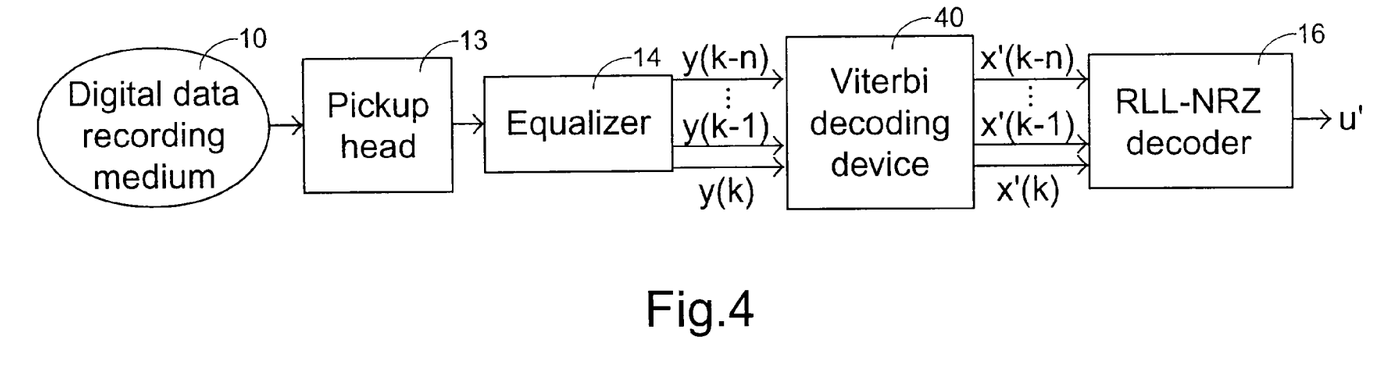
FIG. 4 is a functional block diagram schematically showing a digital data reading-out system comprising a multi-data input and multi-data output Viterbi decoder according to the present invention.

Please refer to FIG. 4. A single Viterbi decoding device 40 is used to process a multi-data input and a multi-data output according to the present invention. In other words, consecutive data y(k−n), . . . , y(k−1), y(k) in the data sequence of the signal Y are simultaneously received by the Viterbi decoding device 40 so as to generate a plurality of read-out signals x'(k−n), . . . , x'(k−1), x'(k).

Figure 5:
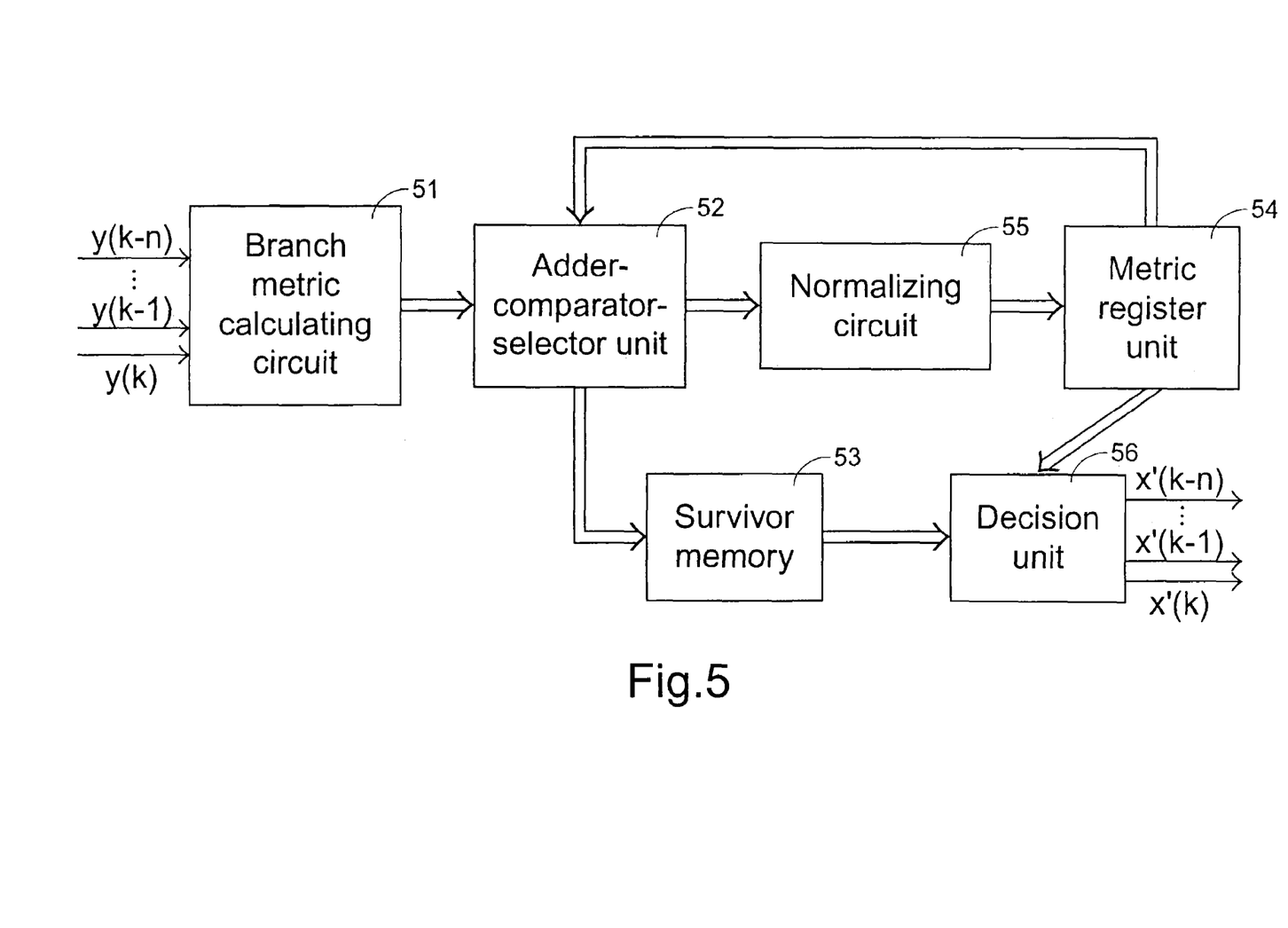
FIG. 5 is a functional block diagram schematically showing an embodiment of the multi-data input and multi-data output Viterbi decoder of FIG. 4.

Further referring to FIG. 5, in which a preferred embodiment of the Viterbi decoding device according to the present invention is illustrated. The Viterbi decoding device includes a branch metric calculating circuit (hereinafter, "BMCU") 51, an adder-comparator-selector unit (ACSU) 52, a survivor memory unit 53, a metric register unit 54, a normalizing circuit 55 and a decision unit 56. The BMCU 51 receives a multi-data input and performs branch metric calculating operations of the input data according to a plurality of target level sets, and obtains a plurality of branch metric values. The branch metric values are transmitted to the adder-comparator-selector unit 52 to perform respective accumulative operations to obtain a plurality of accumulated values. The accumulated values are optionally compared, and a plurality of control signals are generated. In response to the control signals, the least accumulated values are outputted to the metric register unit 54 to be stored. The stored values are further fed back from the metric register unit 54 to the adder-comparator-selector unit 52 to perform next accumulative operations. In order to avoid overflow occurring in the metric register unit 54 due to the increasing accumulated values, the normalizing circuit 55 is provided to perform a normalized shift which reducing all the accumulated values, stored in the metric register unit 54, a same value when the least accumulated values exceed the threshold value. Therefore, the accumulated values will not overflow. As for the survivor memory unit 53, it stores a plurality of probable output-data state transition tracks in response to the control signals. Each output-data state transition track indicates the variation of the read-out signal X' at a current and some preceding time points such as k, k−1, . . . , k−n. Then, the decision unit 56 determines the output data x'(k), x'(k−1), . . . , x'(k−n) of the read-out signal X' according to the least accumulated values stored in the metric register unit 54 and the output-data state transition tracks from the survivor memory unit 53.

Figure 7:
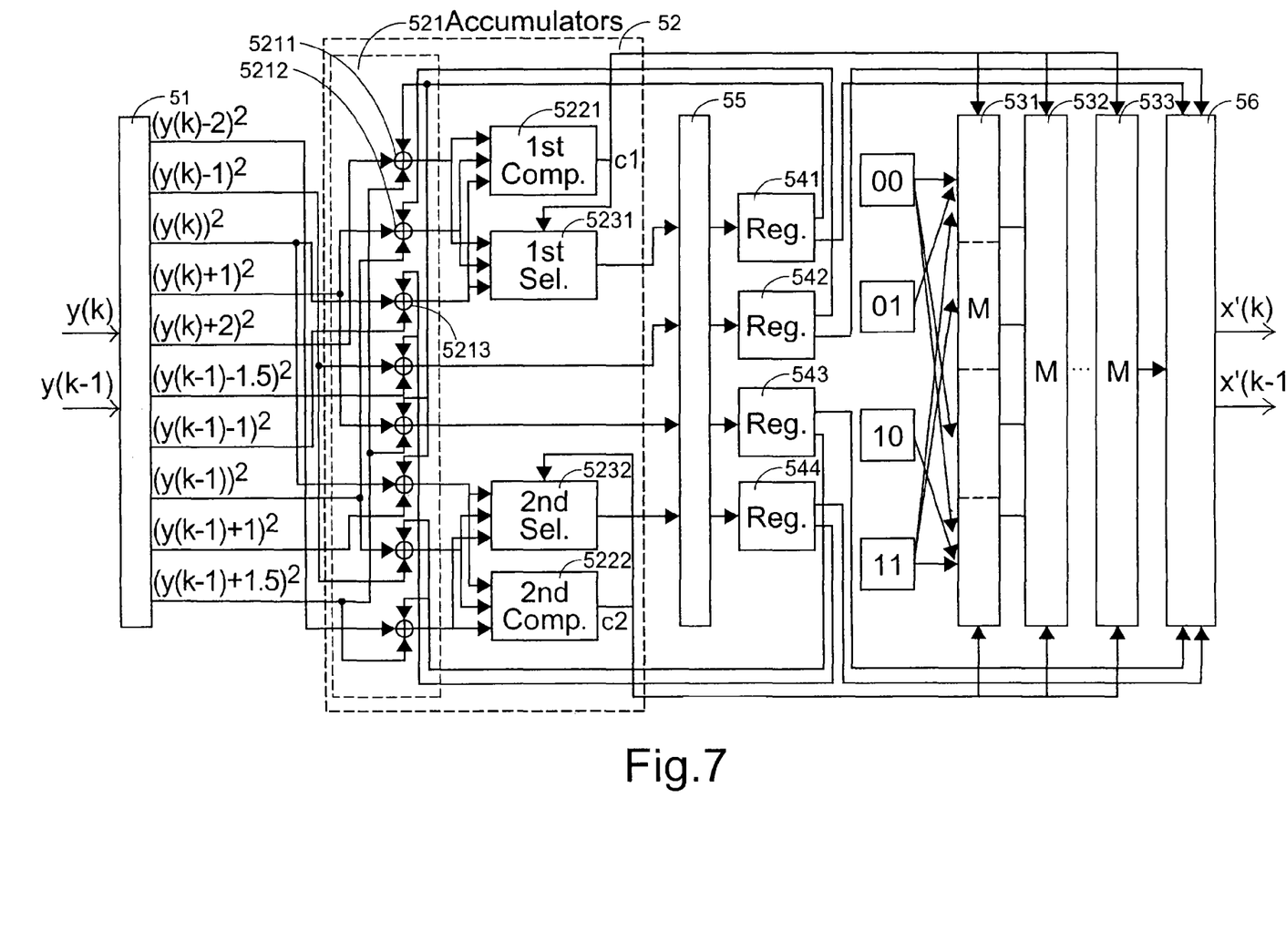
FIG. 7 is a circuit block diagram illustrating an example of the multi-data input and multi-data output Viterbi decoder of FIG. 5.

The present invention is now described in more detail as follows. The BMCU 51 receives the consecutive data y(k−n), . . . , y(k−1), y(k), and then performs branch metric calculating operations of the consecutive data y(k−n), . . . , y(k−1), y(k) according to a plurality target level sets. That is, the differences of the input data with all the corresponding target values are squared to obtain a plurality of branch metric values. For example, it is assumed two consecutive data y(k) and y(k−1) are inputted to the BMCU 51, and two target level sets (2,1,0,−1,−2) and (1.5,1,0,−1,−1.5) are provided in the partial response channel PR(1,1,1,1). Then, branch metric values $(y(k)-2)\hat{0}2$, $(y(k)-1)\hat{0}2$, $(y(k))\hat{0}2$, $(y(k)+1)\hat{0}2$, $(y(k)+2)\hat{0}2$, $(y(k-1)-1.5)\hat{0}2$, $(y(k-1)-1)\hat{0}2$, $(y(k-1))\hat{0}2$, $(y(k-1)+1)\hat{0}2$, $(y(k-1)+1.5)\hat{0}2$ are obtained, as shown in FIG. 7. The target levels vary with the partial response channel of the system. For example, the above target levels are based on PR(1,1,1,1), and the derivation of the target levels will be described hereinafter.

Figure 6A:
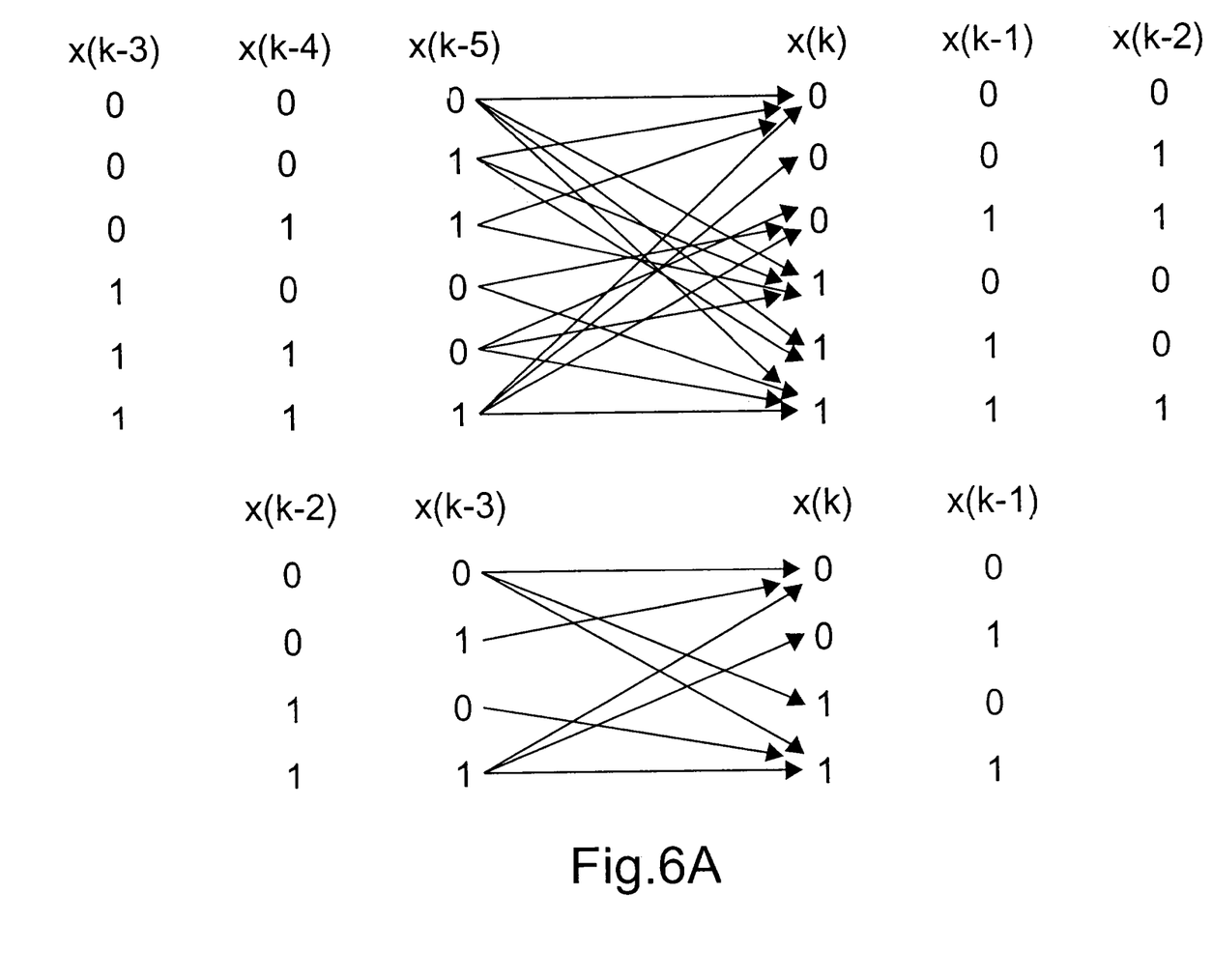
FIG. 6A is a one-step trellis diagram associated with two-bit input of the written-in signal X.
Figure 6B:
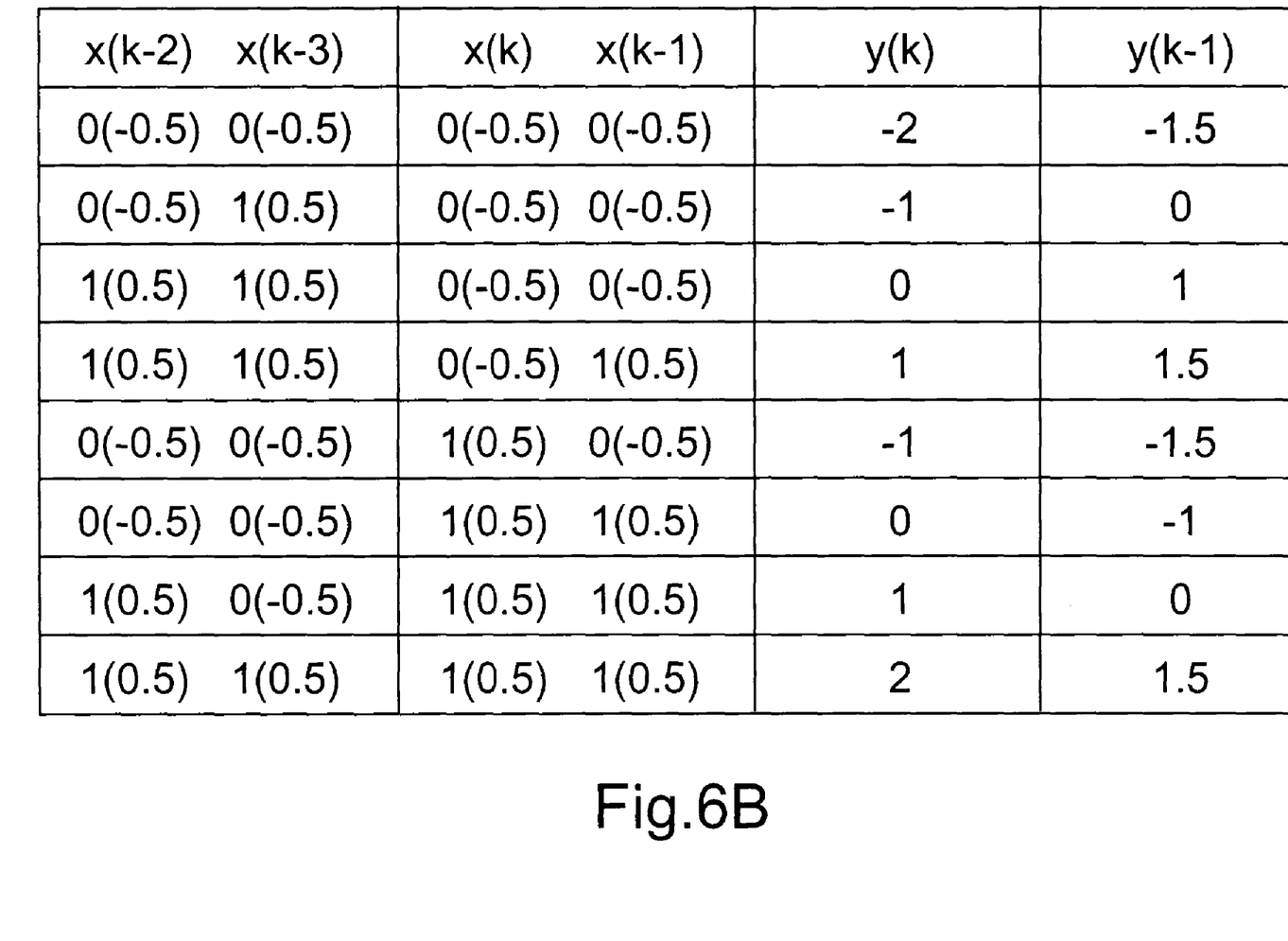
FIG. 6B is a table showing the target levels of the output signal Y of the partial response channel PR(1,1,1,1) in response to the input signal X.

Since the data transmission in an optical disc drive system should follow a 3T run-length limited encoding format, data must be transmitted as a series of three or more consecutive identical bits, e.g. 00011100001111. In other words, isolated one or two identical bits only, e.g. . . . 101 . . . , . . . 1001 . . . , . . . 0110 . . . or . . . 010 . . . , should not be present. Accordingly, referring to FIG. 6A, only selected paths indicated by arrows are reasonable according to the 3T run-length limited algorithm. For example, referring to the one-step trellis associated with two-bit input, when (x(k−2), x(k−3)) is (0,0), (x(k), x(k−1)) is possibly (0,0), (1,0), (1,1) to form a data sequence . . . 0000 . . . , . . . 1000 . . . , . . . 1100 . . . , but impossibly (0,1) because of the formation of a data sequence of . . . 0100 . . . according to the 3T run-length limited algorithm. As derived from the above description, eight possible state transition tracks are obtained for two-bit input. The eight possible state transition ways are listed in a table, as shown in FIG. 6B, in which the written-in signal X and the output signal Y of the partial response PR(1,1,1) are revealed. In the table, the bits "0" and "1" of the input data x(k−3), x(k−2), x(k−1) and x(k) represent voltages values −0.5 and 0.5, respectively. The output data y(k)=x(k)+x(k−1)+x(k−2)+x(k−3), and the output data y(k−1)=x(k−1)+x(k−2)+x(k−3)+x(k−4). Since the voltage value of x(k−4) is not recorded in this example, it is derived by probability estimation. For example, when x(k−1)=0, x(k−2)=0 and x(k−3)=0, x(k−4) can be either 0 or 1, and the probability is fifty to fifty, respectively. As mentioned above, the bits "0" and "1" represent voltages values −0.5 and 0.5, respectively. Then, taking the first row of the table as an example, (x(k), x(k−1), x(k−2), x(k−3)) is (0, 0, 0,0), so y(k)=x(k)+x(k−1)+x(k−2)+x(k−3)=(−0.5)+(−0.5)+(−0.5)+(−0.5)=−2, and y(k−1)=x(k−1)+x(k−2)+x(k−3)+x(k−4)=(−0.5)+(−0.5)+[(½)*(+0.5)+(½)*(−0.5)]=−1.5. For the second row, (x(k), x(k−1), x(k−2), x(k−3)) is (0, 0, 0, 1), so x(k−4) has to be 1 in order to comply with the 3T run-length limited algorithm. Accordingly, y(k)=x(k)+x(k−1)+x(k−2)+x(k−3)=(−0.5)+(−0.5)+(−0.5)+(+0.5)=−1, and y(k−1)=x(k−1)+x(k−2)+x(k−3)+x(k−4)=(−0.5)+(−0.5)+(+0.5)+(+0.5)=0. The other possible values of y(k) and y(k−1) can be derived as above, and thus the target values associated with y(k) are obtained to be (2,1,0,−1,−2) and the target values associated with y(k−1) are obtained to be (1.5,1,0,−1,−1.5).

Further referring to FIG. 7 again, the consecutive data y(k) and y(k−1) and the corresponding target level sets (2,1,0,−1,−2) and (1.5,1,0,−1,−1.5) perform respective branch metric calculation operation in the BMCU 51 to output the branch metric values $(y(k)-2)\hat{0}2$ $(y(k))\hat{0}2$, $(y(k)+2)\hat{0}2$, $(y(k)+2)\hat{0}2$, $(y(k-1)-1.5)\hat{0}2$, $(y(k-1)-1)\hat{0}2$, $(y(k-1))\hat{0}2$ $(y(k-1)+1)\hat{0}2$, $(y(k-1)+1.5)\hat{0}2$ to the adder-comparator-selector unit 52. The adder-comparator-selector unit 52 includes a plurality of accumulators 521, a plurality of comparators including comparators 5221 and 5222, a plurality of selectors 5231 and 5232. In this embodiment, eight accumulators 521 corresponding to the eight possible output-data state transition tracks illustrated with reference to FIG. 6A are provided. The inputs $(y(k)+2)\hat{0}2$, $(y(k-1)+1.5)\hat{0}2$ and fed-back value stored in a register 541 of the metric register unit 54 are added by the first accumulator 5211, and the resulting value indicates a branch metric accumulation value in response to the change from 00 to 00. Likewise, the accumulated value obtained by the second accumulator 5212 indicates a branch metric accumulation value in response to the change from 01 to 00, and the accumulated value obtained by the third accumulator 5213 indicates a branch metric accumulation value in response to the change from 11 to 00. The accumulated values are compared in the comparator 5221, and a two-bit first control signal C1 is outputted according to the comparing result. In response to the control signal C1, the selector 5231 selects the least one of the accumulated values outputted by the accumulators 5211, 5212 and 5213 to be outputted to the register 541 to be stored, and the stored value of the register 541 is fed back to corresponding accumulators of the adder-comparator-selector unit 52 for next accumulation operations. In addition, the accumulated values obtained by the other accumulators indicate branch metric accumulation values in response to the changes from 11 to 01, from 00 to 10, and from 00, 10 or 11 to 11. Likewise, the second comparator 5222 receives and compares associated branch metric accumulation values, and outputs a two-bit second control signals C2 according to the comparing result. The second selector 5232 then outputs the least accumulated values to the register 544 of the metric register unit 54 to be stored. The stored value in the register 544 is fed back to corresponding accumulators of the adder-comparator-selector unit 52 for next accumulation operations. On the other hands, the registers 542 and 543 of the metric register unit 54 receive and store accumulated values directly since no comparison and selection operations are required. The stored values of the register 542 and 543 are also fed back to corresponding accumulators of the adder-comparator-selector unit 52 for next accumulation operations.

The control signals C1 and C2 are further transmitted to the memories 531 and 532 of the survivor memory unit 53. In response to the control signals C1 and C2, respectively, the memories, 531 and 532 store the possible output-data state transition tracks. Each output-data state transition track indicates the state transition of the read-out signal X' at a current and some preceding time points such as k, k−1, . . . , k−n. The output-data state transition tracks are then provided for the decision unit 56. The decision unit 56 outputs the read-out signal X' in two bits, e.g. 00, 01, 10 or 11, at a time. Alternatively, the decision unit 56 determines a two-bit output, which is the majority present in the survivor memory unit 53, to be outputted.

To sum up, according to the present invention, a single Viterbi decoding device is used to process two or more read-out signals at a time. Therefore, high encoding efficiency can be obtained without undesirably occupying too much area of the chip. The present invention can be widely applied to the control chip of a magnetic disk drive system or optical disk drive system.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A Viterbi decoding device with a dual-data input and a dual-data output, comprising:
   a branch metric calculating circuit performing branch metric calculation operations on two consecutive input data according to two sets of target levels, respectively, to obtain a plurality of branch metric values, wherein said two sets of target levels are obtained via a partial response channel PR(1,1,1,1) and are (−2,−1,0,1,2) and (−1.5,−1,0,1,1.5);
   an adder-comparator-selector unit coupled to said branch metric calculating circuit, performing accumulative additional operations of said branch metric values to obtain four groups of accumulated values, respectively, comparing said accumulated values in groups, and outputting two control signals and four least accumulated values according to the comparing results;
   a metric register unit coupled to said adder-comparator-selector unit, receiving and storing said four least accumulated values, and feeding back said four least accumulated values to said adder-comparator-selector unit to perform next accumulative addition operations;
   a survivor memory unit coupled to said adder-comparator-selector unit, recording a plurality of output-data state transition tracks in response to said two control signals; and
   a decision unit coupled to said metric register unit and said survivor memory unit, determining the combination of the two probable output-data state transition tracks as said consecutive output data according to said four least accumulated values.

2. The Viterbi decoding device according to claim 1 further comprising a normalizing circuit coupled to said adder-comparator-selector unit and said metric register unit, performing a normalized shift when said least accumulated values exceed the threshold value.

3. The Viterbi decoding device according to claim 1 wherein said adder-comparator-selector unit comprises:

a plurality of accumulators coupled to said branch metric calculating circuit, performing accumulative operations of said plurality of branch metric values for said plurality of output-data state transition tracks, respectively;
two comparators coupled to said plurality of accumulators, comparing two of said four groups of accumulated values so as to output said two control signals, respectively; and
two selectors coupled to said plurality of accumulators, said two comparators and said metric register unit, outputting said four least accumulated values that stored in said metric register unit in response to said two control signals, respectively.

4. The Viterbi decoding device according to claim 1 wherein said metric register unit includes four registers.

5. The Viterbi decoding device according to claim 1 wherein said survivor memory unit comprises a plurality of memories coupled in series.

6. The Viterbi decoding device according to claim 1 wherein said plurality of output-data state transition tracks are determined according to a 3T run-length limited algorithm.

7. A Viterbi decoding method with a multi-data input into a multi-data output, comprising of:
   providing two target level sets obtained via a partial response channel PR(1,1,1,1) which are (−2,−1,0,1,2) and (−1.5,−1,0,1,1.5), respectively;
   performing branch metric calculating operations of a plurality of consecutive input data according to said two target level sets to obtain a plurality of branch metric values, respectively;
   performing accumulative additional operations of said branch metric values to obtain a plurality of accumulated values, respectively, comparing said plurality of accumulated values in groups, and outputting a plurality of control signals and a plurality of least accumulated values according to the comparing results;
   storing said plurality of least accumulated values, and feeding back said plurality of least accumulated values to said adder-comparator-selector unit to perform next accumulative additional operations; and
   recording a plurality of output-data state transition tracks in response to said control signals, and determining the combinations of a plurality of probable output-data state transition tracks as said consecutive output data according to said least accumulated values, wherein said plurality of output-data state transition tracks are determined according to a 3T run-length limited algorithm and wherein said consecutive input data and said consecutive output data are two-bit input and two-bit output, and eight output-data state transition tracks are recorded.

8. The Viterbi decoding method according to claim 7, further comprising performing a normalized shift said least accumulated values exceed the threshold value.

* * * * *

UNITED STATES PATENT AND TRADEMARK OFFICE
CERTIFICATE OF CORRECTION

PATENT NO. : 7,185,269 B2
APPLICATION NO. : 10/612678
DATED : February 27, 2007
INVENTOR(S) : William Mar et al.

It is certified that error appears in the above-identified patent and that said Letters Patent is hereby corrected as shown below:

On Title Page Item 30 "Foreign Application Priority Data" please delete "91114690" and replace it with --091114690--.

Column 1 beginning at line 55, please delete "Accordingly, the transfer function can be adjusted into "Y(D)/X(D)=PR(1,1)=1+D", "Y(D)/X(D)=PR (1,2,1)=1+2*D+D$\hat{0}$2" or "Y(D)/X(D)=PR(1,1,1)=1+D+D$\hat{0}$2+D$\hat{0}$3"." and replace it with --Accordingly, the transfer function can be adjusted into "Y(D)/X(D) = PR(1,1) = 1 + D", "Y(D)/X(D) = PR(1,2,1) = 1 + 2 * D + D^2" or "Y(D)/X(D) = PR (1,1,1,1) = 1 + D + D^2 + D^3".--.

Column 1, line 66, please delete "PR(1,2,1) = 1 + 2*D + D$_\wedge$2" and replace it with --PR(1,2,1) = 1 + 2*D + D^2--.

Column 2 beginning at line 5, please replace "PR(1,1,1,1) = 1 + D + D$_\wedge$2 + D$_\wedge$3" with --PR(1,1,1,1) = 1 + D + D^2 + D^3--.

Column 5 beginning at line 25, please replace "Then, branch metric values (y(k)-2)$\hat{0}$2, (y(k)-1)$\hat{0}$2, (y(k))$\hat{0}$2, (y(k)+1)$\hat{0}$2, (y(k)+2)$\hat{0}$2, (y(k-1)-1.5)$\hat{0}$2, (y(k-1)-1)$\hat{0}$2, (y(k-1))$\hat{0}$2, (y(k-1)+1)$\hat{0}$2, (y(k-1)+1.5)$\hat{0}$2 are obtained" with --Then, branch metric values (y(k)-2)^2, (y(k)-1)^2, (y(k))^2, (y(k)+1)^2, (y(k)+2)^2, (y(k-1)-1.5)^2, (y(k-1)-1)^2, (y(k-1))^2, (y(k-1)+1)^2, (y(k-1)+1.5)^2 are obtained--.

Column 6 beginning at line 13, please replace "to output the branch metric values (y(k)-2)$\hat{0}$2 (y(k))$\hat{0}$2, (y(k)+2)$\hat{0}$2, (y(k)+2)$\hat{0}$2, (y(k-1)-1.5)$\hat{0}$2, (y(k-1)-1)$\hat{0}$2, (y(k-1))$\hat{0}$2) (y(k-1)+1)$\hat{0}$2, (y(k-1)+1.5)$\hat{0}$2 to the adder-comparator-selector unit 52" with

UNITED STATES PATENT AND TRADEMARK OFFICE
CERTIFICATE OF CORRECTION

PATENT NO. : 7,185,269 B2
APPLICATION NO. : 10/612678
DATED : February 27, 2007
INVENTOR(S) : William Mar et al.

It is certified that error appears in the above-identified patent and that said Letters Patent is hereby corrected as shown below:

--to output the branch metric values $(y(k)-2)^2$, $(y(k)-1)^2$, $(y(k))^2$, $(y(k)+1)^2$, $(y(k)+2)^2$, $(y(k-1)-1.5)^2$, $(y(k-1)-1)^2$, $(y(k-1))^2$, $(y(k-1)+1)^2$, $(y(k-1)+1.5)^2$ to the adder-comparator-selector unit 52--.

Signed and Sealed this

Twenty Second Day of April, 2008

JON W. DUDAS
*Director of the United States Patent and Trademark Office*